United States Patent [19]

Nozaka

[11] Patent Number: 4,915,967

[45] Date of Patent: Apr. 10, 1990

[54] METHOD FOR PROCESSING FOOD

[75] Inventor: Tooru Nozaka, Nakano, Japan

[73] Assignee: Shonan Koryo Corporation, Tokyo, Japan

[21] Appl. No.: 216,605

[22] Filed: Jul. 8, 1988

[30] Foreign Application Priority Data

Jul. 28, 1987 [JP] Japan .................. 62-188596

[51] Int. Cl.⁴ .................. A23L 2/26; A23L 1/325
[52] U.S. Cl. .................. 426/489; 426/431; 426/599; 426/643
[58] Field of Search .............. 426/495, 518, 599, 643, 426/431

[56] References Cited

U.S. PATENT DOCUMENTS 4,499,112 2/1985 Miller et al. .................. 426/599

*Primary Examiner*—George Yeung

[57] ABSTRACT

The present invention relates to a method for processing prepared materials of fruits, vegetables and fishery products under a nitrogen gas atmosphere at a gauge pressure of 150 KPa and more by using physical steps to prevent the oxidation of the processed materials and the undesirable propagation of micro-organisms, and to maintain the natural flavor of the materials.

24 Claims, No Drawings

METHOD FOR PROCESSING FOOD

BACKGROUND OF THE INVENTION

The present invention relates to a method for processing prepared materials of fruits, vegetables and fishery products, and especially to a method provided by means of specific physical steps.

BACKGROUND OF THE INVENTION

Heretofore, in the process of preparing fruits, vegetables and fishery products, many kinds of methods have been used to prevent the oxidation of processed materials or the propagation of micro-organisms and to protect such processed materials from deterioration. Chemical methods such as, for example, the addition of sulfur dioxide, ascorbic acid or ethanol have been used. However, these compounds present difficulties in that the particular kind of compound and quantity thereof must be used properly according to the properties of the materials, the objectives to be achieved, the environment within which the compounds are to be used, and the like. There are additional problems presented by these compounds by which tastes, flavors and the like are changed during the process, and natural flavors are lost. As a result, such compounds are not able to be universally employed. Physical methods such as, for example, a vacuum method or an inert gas substitution method have also been tried. However, the vacuum method has a disadvantage in that the flavors are rendered volatile. The inert gas substitution method has a disadvantage in that it is difficult to obtain an oxygen partial pressure level which is sufficiently low so as to prevent oxidation.

Accordingly, there are no conventionally available treatment methods for maintaining the natural flavors within fruits, vegetables or fishery products and for effectively preventing oxidation thereof.

The present inventor has earnestly strived to obtain a method in which the above problems are wholly resolved, wherein processed materials can maintain their natural flavors, and wherein oxidation of the materials and the propagation of micro-organisms can be sufficiently prevented. As the a result, the inventor has devised an effective physical means by which prepared materials such as fruits, vegetables and fishery products are processed under a nitrogen gas atmosphere.

SUMMARY OF THE INVENTION

The present invention comprises a method for processing food characterized in that prepared materials, such as, for example, fruits, vegetables or fishery products are processed under a nitrogen gas atmosphere at a gauge pressure of 150 KPa or more and encompassing the use of at least one or more steps selected from crushing, extraction, squeezing, filtration and concentration.

The fruits to be used in accordance with the present invention are in no way limited, and the fruits that are raw materials of unrefined products, such as, for example, puree, fruit wine or fruit juice can also be used.

Similarly, the vegetables from which puree, vegetable juice and the like are derived are in no way.

The fishery products used in accordance with the present invention are able to contain not only fresh sea food but also processed goods such as, for example, dried bonito from which materials can be derived by extraction.

The prepared materials used in accordance with the present invention contain fruits, vegetables and fishery products obtained by washing, selecting and then removing the skin or seed portions thereof.

The steps for processing these prepared materials suitable for use in accordance with the present invention are as follows.

Firstly, the prepared materials are treated with a crusher or a cutter, and crushed materials are obtained. The crushed materials are inserted into a grinding mill and ground, and a mash is obtained. The mash is treated by means of a pulper and is strained, and a puree is obtained. Otherwise, the mash is treated by means of a squeezer and fruit juice is obtained, and the juice may serve as must for wine. Then, the juice is treated by means of a centrifugal separator, the obtained liquid is treated by means of an ultrafilter (UF) and a transparent filtrate (clear fruit juice) is obtained. Otherwise, the centrifuged liquid is treated by means of a reverse osmosis (RO) dehydrator and concentrated liquid (concentrated fruit juice) is obtained. Furthermore, an extract of sea food is generally obtained by extraction in hot water. Namely, fishery products such as, for example, dried bonitos, oysters and the like are dipped into hot water, and then filtered. The obtained filtrate is treated by means of a reverse osmosis dehydrator and the concentrated extract is obtained.

In accordance with the present invention, the prepared materials are processed by employing one or more steps, such as, for example, the crushing of the prepared materials, the grinding of the crushed materials, the straining or squeezing of the mash, the centrifugation of the juice, the filtration or dehydration of the juice obtained by means of centrifugation step, or the hot water extraction of the prepared materials and the like, under inert gas conditions, preferably in an atmosphere of nitrogen gas at a gauge pressure of 150 KPa or more, and preferably within the range of 150 KPa–12 MPa. More particularly, devices which do not normally include closures, such as, for example, a crusher or a cutter, a squeezer and the like, can be closed by means of suitable closures or covers, and devices which are normally closed, such as, for example, a grinding mill, a centrifugal separator, an ultrafilter, a reverse osmosis dehydrator and the like, can be used as they are and nitrogen gas can be injected thereinto under the specifically noted pressurized conditions. These devices are preferably connected by means of suitable pipes or conduits and a closed system is maintained. When the system is maintained under a nitrogen gas atmosphere at a gauge pressure of 150 KPa or more, the relative oxygen concentration within the gas which remains within the process materials is extremely low. When the gauge pressure is less than 150 KPa, the desired results of the present invention cannot be attained. When the gauge pressure is more than 12 MPa, the device becomes overloaded and such is not preferable.

By using the present invention which is constituted as described above, the following effects are obtained:

(1) As the food is treated under a nitrogen gas atmosphere at a constant pressure, the partial pressure of oxygen is drastically reduced within the process system, and the oxygen concentration within the gas which is dissolved within the processed materials is likewise drastically reduced. As a result, the oxidation of the process materials and the undesirable propagation of micro-organisms can be prevented.

(2) As the nitrogen gas release continues from the process materials under low pressure conditions, the oxidation of the process materials can be continuously prevented under a stable atmosphere.

(3) As the process is conducted within a closed system, and only the nitrogen gas is allowed to dissolve within the process materials, the natural flavor of the food is not lost.

As described above, the present invention may be used in connection with a large diversity of materials so as to achieve its objectives. Furthermore, the present invention is applicable with respect to the processing of human or animal medicines, agricultural medicines, dyes and the like not only by treating fluids, vegetables and fishery products, but also by treating medical plants, wild plants, fungi and the like.

DESCRIPTION OF PREFERRED EMBODIMENTS

The following examples illustrate the present invention more specifically.

EXAMPLE 1

Prepared apples were processed by means of a crusher, and 10 t of the crushed materials were deposited within a grinding mill which was maintained at a gauge pressure of 150 KPa under a nitrogen atmosphere. The ground materials were then pressed in a squeezer, which was connected with the grinding mill through means of an attached stainless steel airtight cover, and squeezed for two minutes. The squeezer was of the screw press type, the retention volume was 300 kg and the treatment ability was 10 t/hour. The obtained juice was continuously processed by means of a centrifugal separator so as to control pulp content and 7.8 t of apple juice were obtained.

COMPARISON EXAMPLE 1

In comparison with Example 1, 7.7 t of apple juice were obtained by the same method as in Example 1 except that the nitrogen gas pressure was maintained at 80 KPa.

Each one liter of the juice obtained in accordance with the process of Example 1 which is one embodiment of this invention and the juice obtained in accordance with the Comparison Example 1, which is a control process, was then subjected to testing so as to detect the presence of growth of micro-organisms by means of a sanitary test method adopted by means of the Japanese Pharmaceutical Association, and a taste test (an organoleptic test) was also conducted by means of an organoleptic panel of twenty-four persons. In the taste test, blind-folded persons judged whether each sample was good or not, and these results were synthetically decided and marked with o=good and x=bad. The results are shown in Table 1.

TABLE 1

|  | Sample of this invention | Sample of control |
|---|---|---|
| JAS* items: Sugar | 10.6° BX | 10.6° BX |
| Acidity | 0.31% | 0.32% |
| Ash | 0.21% | 0.22% |
| Amino-N | 8.5 mg % | 8.5 mg % |
| Micro-organic test: |  |  |
| General bacilli | 1200/ml | 3500/ml |
| Mold, Yeast | 450/ml | 1000/ml |
| Colitis germs | 81/ml | 150/ml |
| Organoleptic test: |  |  |

TABLE 1-continued

|  | Sample of this invention | Sample of control |
|---|---|---|
| (persons/persons) | 20/24 | 4/24 |
| Synthetic judgement | o | x |

*JAS: Japanese Agricultural Standard

EXAMPLE 2

Four tons of apple juice were conducted through an ultrafilter maintained at a gauge pressure of approximately 500 KPa under a nitrogen gas atmosphere.

The ultrafilter comprised 60 modules of tubular membranes having an area of 1.6 m$^2$, a circulating pump, and a tank, and the membrane area was 96 m$^2$. The flux was 35 l/m$^2$ hour and the filtration time was 1.2 hours. The total volume of the filtrate containing a liquid obtained by washing of the pulp was 4.1 t.

COMPARISON EXAMPLE 2

By means of the same method as in Example 1 except that the nitrogen gas was absent, 3.9 t of the filtrate was obtained.

Each one liter of the filtrate obtained in accordance with the process of Example 2 and the filtrate obtained in accordance with the process of Comparison Example 2 was subjected to testing by means of the same method as described in Comparison Example 1. The results are shown in Table 2.

TABLE 2

|  | Sample of this invention | Sample of control |
|---|---|---|
| JAS items: Sugar | 9.6° BX | 9.5° BX |
| Acidity | 0.29% | 0.28% |
| Ash | 0.20% | 0.20% |
| Amino-N | 7.7 mg % | 7.5 mg % |
| Micro-organic test: |  |  |
| General bacilli | 18/ml | 79/ml |
| Mold, Yeast | 13/ml | 12/ml |
| Colitis germs | 11/ml | 15/ml |
| Organoleptic test: |  |  |
| (persons/persons) | 21/24 | 3/24 |
| Synthetic judgement | o | x |

EXAMPLE 3

Four tons of juice were forced into a reverse osmosis dehydrator of the plate type which was maintained at a gauge pressure of about approximately 12 MPa under a nitrogen gas atmosphere. The dehydrator was equipped with 150 m$^2$ of a membrane having high level rejection characteristics, and the flow rate was maintained by means of an external drive system. The juice was treated at an initial flux of 20 l/m$^2$ hour, and a terminal flux of 5 l/m$^2$ hour for about approximately one hour. When the concentration of the juice within the equipment attained the desired concentration (41° BX), the juice was removed. 0.5 t of the concentrated juice was obtained.

COMPARISON EXAMPLE 3

For comparison, the nitrogen gas method was changed to a method using a common reverse osmosis dehydrator which was circulated by means of a pump within a conventional atmosphere. However, the desired concentration of the juice within the equipment could not be obtained because the juice was fermented.

One liter of the concentrate which was obtained in Example 3 was tested. The results are shown in Table 3.

TABLE 3

|  | Sample of this invention | Sample of control |
|---|---|---|
| JAS items: Sugar | 41.2° BX |  |
| Acidity | 1.25% |  |
| Ash | 0.85% | Unmeasured |
| Amino-N | 33.2 mg % |  |
| Micro-organic test: |  |  |
| General bacilli | 1300/ml |  |
| Mold, Yeast | 15/ml | Unmeasured |
| Colitis germs | 120/ml |  |
| Organoleptic test: |  |  |
| (persons/persons) | 24/24 | 0/24 |
| Synthetic judgement | o | x |

EXAMPLE 4

Dried bonito was extracted in hot water, and 8.5 t of the extract were filtered. The obtained filtrate was pumped into a reverse osmosis dehydrator of the spiral type which was maintained at about approximately 5 MPa under a nitrogen gas atmosphere. The dehydrator was equipped with eight vessels each containing three 6.8 m² elements inside, a high pressure tank of the full load type and a circulating pump, and the membrane area was 160 m². Subsequently, the filtrate was treated at an initial flux of 15 l/m² hour and a terminal flux of 6 l/m² hour for 4.8 hours, 1.3 t of the concentrated extract were obtained.

COMPARISON EXAMPLE 4

For comparison, the nitrogen gas pressure method was changed to a method using the common reverse osmosis dehydrator which was circulated by means of a pump within a conventional atmosphere. In order to prevent the proliferation of micro-organisms, the dehydrator was maintained at temperatures of 15° C. and 50° C., and the filtered extract was concentrated. The flux was 6 l/m² hour during the treatment process at 15° C. and its flavor was remarkably adversely affected, and the deterioration of the flavor of the concentrate was also remarkably reduced during the treatment process at 50° C., so that the obtained concentrate could not be put to practical use.

However, the concentrate obtained in accordance with Example 4 gave a good synthetic judgement because the proliferation of microorganisms was little and the organoleptic test of the flavor showed results of 24/24. The results are shown in Table 4.

TABLE 4

|  |  | Sample of control | |
|---|---|---|---|
| Item | Sample of this Invention | 50° C. | 15° C. |
| All solid Component % | 8.52 | 8.49 | 3.26 |
| All nitrogen % | 1.24 | 1.21 | 0.40 |
| Organoleptic test: |  |  |  |
| (persons/persons) | 24/24 | 3/24 | — |
| Synthetic judgement | o | x | x |

EXAMPLE 5

Twenty kilograms of apples which were crushed along with 400 ppm of vitamin C were deposited in closed tanks (50 L volume) fitted with an agitator, and the atmosphere was replaced with nitrogen gas. The tanks were closed and maintained at gauge pressures of 0.00, 0.10, 0.17, 0.50, 1.50 and 3.00 MPa, respectively. After the apples were ground fine and thoroughly mixed for 15 minutes, the tanks were opened under atmospheric pressure conditions, and the degrees of browning were compared by determining their optical densities. The results are shown in Table 5.

As can be seen from the results, the speed characterizing a color change in the apples decreased with an increasing level of the nitrogen gas pressures, and the effect was rémarkable in pressures over 0.15 MPa.

TABLE 5

| Nitrogen pressure (MPa) | ΔOD | | | |
|---|---|---|---|---|
|  | 0.10 | 0.15 | 0.25 | 0.35 |
|  | Time up to the extent of ΔOD value (hour) | | | |
| 0.00 | 2.00 | 2.22 | 2.68 | 3.12 |
| 0.10 | 2.38 | 2.80 | 3.22 | 3.62 |
| 0.17 | 2.97 | 3.28 | 3.68 | 4.22 |
| 0.50 | 3.33 | 3.73 | 4.38 | 4.97 |
| 1.50 | 3.80 | 4.50 | 5.67 | 6.68 |
| 3.00 | 4.38 | 5.33 | 7.12 | 8.32 |

In addition, the ΔOD value of the sample in which the substitution of nitrogen gas was not conducted was attained at 0.35 within 13 minutes.

The line tissues of the being processed are killed by means of the crushing operation, enzymic and nonenzymic changes in the fruits began rapidly, and the fresh flavor is gradually lost. The degree of browning is an important index of the flavor. The value of ΔOD=0.15 indicates a level at which the browning is observed with the naked eye and the value of ΔOD=0.35 indicates a level at which the fresh flavor of apples is apparently lost.

The method for determining ΔOD is as follows:

1. The preparation method of the samples: fruit juice and 95% ethanol were mixed in the ratio of 1:1 and filtered with Toyo filter paper No. 2.

2. The determination: the sample was inserted in a 10 mm glass cell, and the absorbance was observed at 430 and 660 nm by using purified water as a control.

As a result, OD430−OD660=ΔOD is obtained.

Obviously, many modifications and variations of the present invention are possible in light of the above teachings. It is therefore to be understood that within the scope of the appended claims, the present invention may be practiced otherwise than as specifically described herein.

I claim:

1. A method for processing food, comprising:
   subjecting a food material, selected from the group consisting of fruits, vegetables, and fishery products, to one or more processing steps selected from a group consisting of extracting, filtering, and concentrating, under a nitrogen gas atmosphere at a gauge pressure of at least 150 KPa, thereby preventing oxidation of said food material and the growth of microorganisms therein.

2. A method as set forth in claim 1, wherein:
   said one or more processing steps comprises extracting.

3. A method as set forth in claim 1, wherein:
   said one or more processing steps comprises filtering.

4. A method as set forth in claim 1, wherein;
   said one or more processing steps comprises concentrating.

5. A method as set forth in claim 1, further comprising:
centrifuging said food material under said nitrogen gas atmosphere.

6. A method as set forth in claim 1, wherein:
said gauge pressure is within the range of 150 KPa–12 MPa.

7. A method as set forth in claim 1, wherein:
said food materials are fruits.

8. A method as set forth in claim 7, wherein:
said fruits are apples.

9. A method as set forth in claim 1, wherein:
said gauge pressure is 500 KPa.

10. A method as set forth in claim 1, wherein:
said food materials are fishery products.

11. A method as set forth in claim 10, wherein:
said fishery products are dried bonitos.

12. A method as set forth in claim 10, wherein:
said fishery products are oysters.

13. A method as set forth in claim 1, wherein:
said gauge pressure is 5 MPa.

14. A method as set forth in claim 1, further comprising:
subjecting said food materials to processing within a reverse osmosis dehydrator.

15. A method as set forth in claim 2, wherein:
in addition to said extracting step, said method further comprises squeezing said food material under said nitrogen gas atmosphere.

16. A method as set forth in claim 3, wherein:
in addition to said filtering step, said method further comprises squeezing said food material under said nitrogen gas atmosphere.

17. A method as set forth in claim 4, wherein:
in addition to said concentrating step, said method further comprises squeezing said food material under said nitrogen gas atmosphere.

18. A method as set forth in claim 5, further comprising:
squeezing said food material under said nitrogen gas atmosphere.

19. A method as set forth in claim 14, further comprising:
squeezing said food material under said nitrogen gas atmosphere.

20. A method as set forth in claim 2, wherein:
in addition to said extracting step, said method further comprises crushing said food material under said nitrogen gas atmosphere.

21. A method as set forth in claim 3, wherein:
in addition to said filtering step, said method further comprises crushing said food material under said nitrogen gas atmosphere.

22. A method as set forth in claim 4, wherein:
in addition to said concentrating step, said method further comprises crushing said food material under said nitrogen gas atmosphere.

23. A method as set forth in claim 5, further comprising:
crushing said food material under said nitrogen gas atmosphere.

24. A method as set forth in claim 14, further comprising:
crushing said food material under said nitrogen gas atmosphere.

* * * * *